(12) United States Patent
Kuniyasu

(10) Patent No.: US 7,054,135 B2
(45) Date of Patent: May 30, 2006

(54) MULTILAYERED STRUCTURE, MULTILAYERED STRUCTURE ARRAY AND METHOD OF MANUFACTURING THE SAME

(75) Inventor: Toshiaki Kuniyasu, Kaisei-machi (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 11/220,693

(22) Filed: Sep. 8, 2005

(65) Prior Publication Data

US 2006/0067029 A1    Mar. 30, 2006

(30) Foreign Application Priority Data

Sep. 24, 2004    (JP) .............................. 2004-278003

(51) Int. Cl.
*H01G 4/228* (2006.01)
(52) U.S. Cl. ................... 361/306.3; 361/311; 361/329; 361/321.2; 29/25.42
(58) Field of Classification Search ................ 361/303, 361/306.1, 306.3, 311–313, 321.2, 321.3, 361/328–329, 322, 301.1; 29/25.41, 25.42
See application file for complete search history.

(56) References Cited

U.S. PATENT DOCUMENTS

| | | | | |
|---|---|---|---|---|
| 5,548,474 A | * | 8/1996 | Chen et al. ................. | 361/313 |
| 6,011,683 A | * | 1/2000 | Dat .......................... | 361/306.1 |
| 6,254,715 B1 | * | 7/2001 | Okazaki et al. ............. | 156/280 |
| 6,413,283 B1 | * | 7/2002 | Day et al. .................. | 29/25.03 |
| 6,631,070 B1 | * | 10/2003 | Schmidt et al. .......... | 361/321.2 |

FOREIGN PATENT DOCUMENTS

JP    61-32835 B2    7/1986

* cited by examiner

*Primary Examiner*—Anthony Dinkins
(74) *Attorney, Agent, or Firm*—Sughrue Mion, PLLC

(57) ABSTRACT

A multilayered structure array has narrow pitches by making thinner coatings for insulating internal electrode layers from side electrodes and the productivity of the multilayered structure array is improved. The multilayered structure includes: a first internal electrode layer; a piezoelectric layer formed on the first internal electrode layer; a second internal electrode layer formed on the piezoelectric layer; a first coating formed on an end surface of the first internal electrode layer in a first side surface region of the multilayered structure and containing one of metal oxide, metal nitride, metal fluoride and metal sulfide in at least one part thereof; and a second coating formed on an end surface of the second internal electrode layer in a second side surface region of the multilayered structure and containing one of metal oxide, metal nitride, metal fluoride and metal sulfide in at least one part thereof.

20 Claims, 15 Drawing Sheets

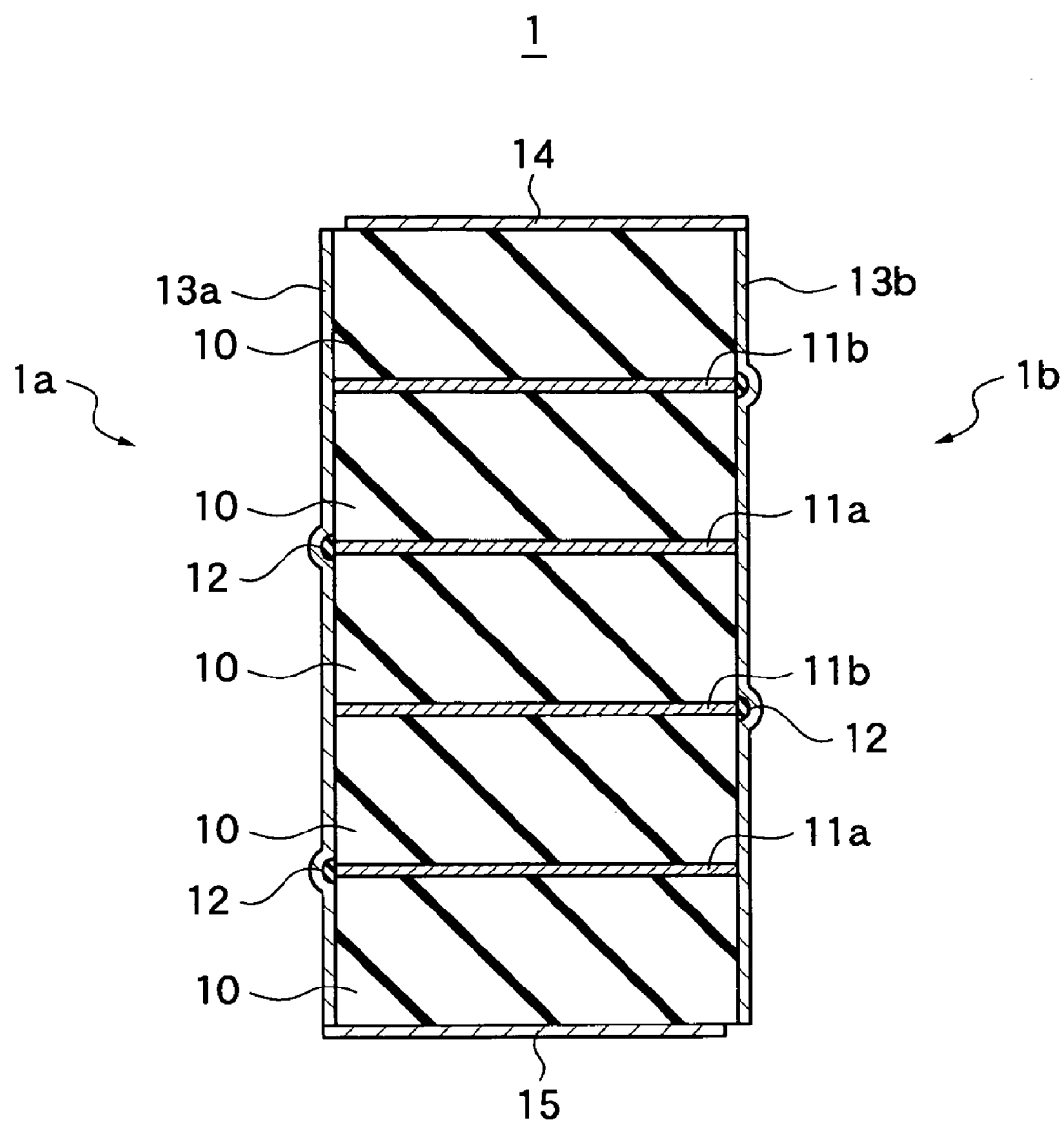

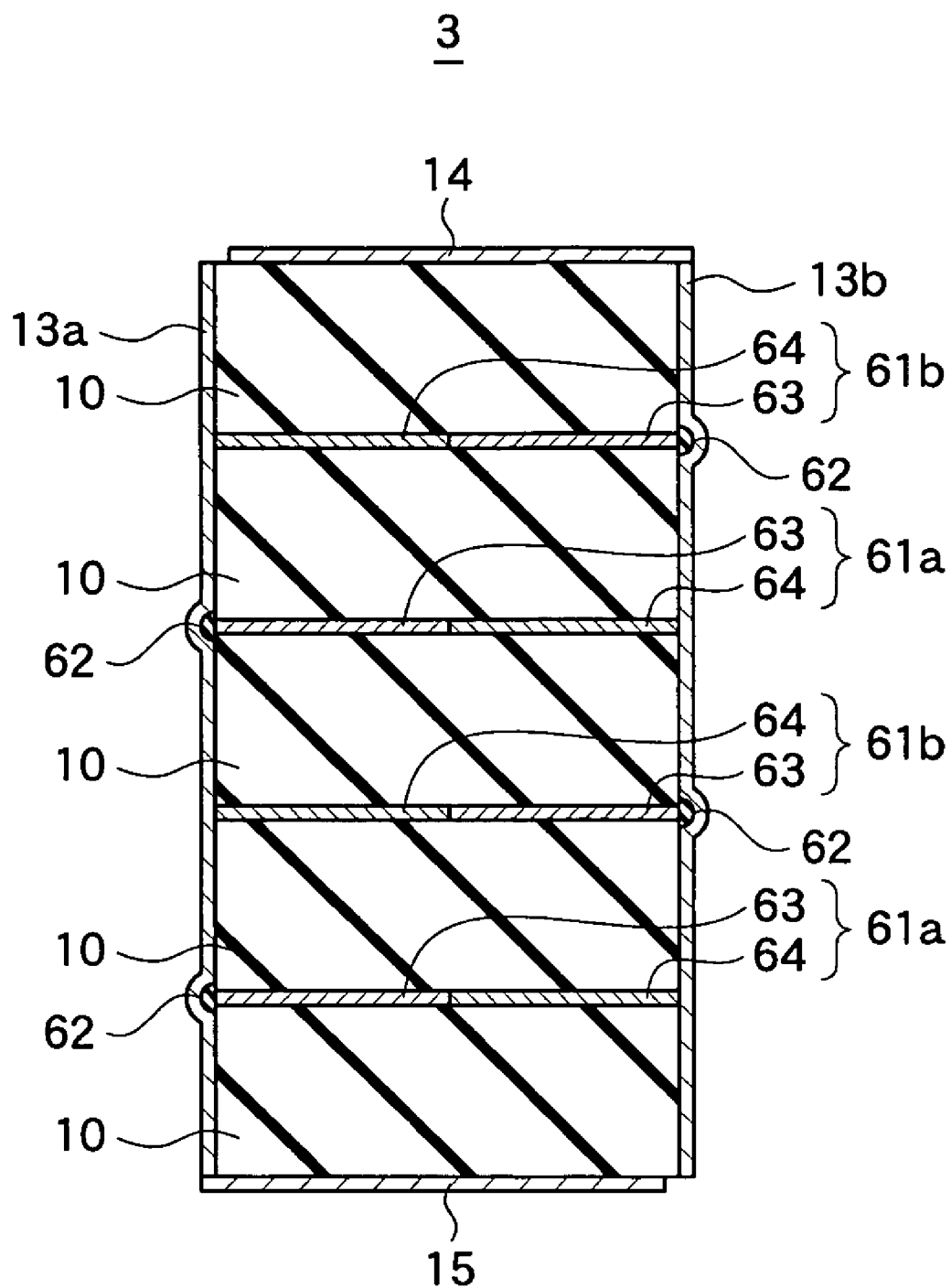

MULTILAYERED STRUCTURE, MULTILAYERED STRUCTURE ARRAY AND METHOD OF MANUFACTURING THE SAME

BACKGROUND OF THE INVENTION

1. Field of the Invention

The present invention relates to a multilayered structure in which insulating layers and electrode layers are alternately stacked, a multilayered structure array in which plural multilayered structures are arranged, and a method of manufacturing the multilayered structure or the multilayered structure array.

2. Description of a Related Art

Multilayered structures, in each of which insulating (dielectric) layers and electrode layers are alternately formed, are utilized not only for multilayered capacitors but also for various uses such as piezoelectric pumps, piezoelectric actuators, and ultrasonic transducers. In recent years, with the developments of MEMS (micro electro mechanical systems) related devices, elements each having such a multilayered structure have been microfabricated still further and packaged more densely.

In microfabrication of an element having opposed electrodes, since the smaller the area of the element is made, the smaller the capacity between the electrodes becomes, a problem that the electrical impedance of the element rises occurs. For example, when the electrical impedance rises in a piezoelectric actuator, the impedance matching cannot be taken with a signal circuit for driving the piezoelectric actuator and power becomes difficult to be supplied, and thereby, the performance as the piezoelectric actuator is degraded. Alternatively, in an ultrasonic transducer using a piezoelectric element, oscillation intensity of ultrasonic wave is dropped. Accordingly, in order to enlarge the capacity between electrodes while microfabricating the element, plural piezoelectric material layers and plural electrode layers are alternatively stacked. This is because the capacity between electrodes of the entire element can be made larger by connecting the stacked plural layers in parallel.

In such a multilayered structure, in order to connect the plural internal electrode layers to one another, interconnection is performed on the side surfaces of the multilayered structure. FIG. 15 is a sectional view for explanation of a general interconnection method of a multilayered structure. The multilayered structure 100 includes plural piezoelectric material layers 101, plural internal electrode layers 102 and 103, and two side electrodes 104 and 105. The internal electrode layers 102 are formed such that one end thereof may extend to one wall surface of the multilayered structure and connected to the side electrode 104 and insulated from the side electrode 105. Further, the internal electrode layers 103 are formed such that one end thereof may extend to the other wall surface of the multilayered structure and connected to the side electrode 105 and insulated from the side electrode 104. By applying a potential difference between the side electrode 104 and the side electrode 105, an electric field is applied to the piezoelectric material layers 101 disposed between the internal electrode layers 102 and the internal electrode layers 103, and the piezoelectric material layers 101 expand and contract by the piezoelectric effect.

By the way, as shown in FIG. 15, in the layers in which the internal electrode layers 102 and 103 are disposed, insulating regions 106 in which no electrode is formed are provided for insulating the electrode layers from either of the side electrodes. The insulating regions 106 do not expand or contract even when a voltage is applied to the multilayered structure 100. On this account, there is a problem that stress is concentrated on the part and the part becomes easy to break.

A multilayered structure shown in FIG. 16 is known as one using another interconnection method in the multilayered structure. The multilayered structure 200 shown in FIG. 16 has plural piezoelectric material layers 201, plural internal electrode layers 202, insulating films 203 formed on one end surfaces of the respective internal electrode layers 202, and two side electrodes 204 and 205. In the adjacent two internal electrode layers 202, the end surfaces on the opposite sides are covered by the insulating films 203 and the layers are insulated from either one of the side electrodes 204 and 205, and thereby, a circuit equivalent to the multilayered structure 100 shown in FIG. 15 can be realized.

As shown in FIG. 16, in the multilayered structure 200, since the internal electrode layers 202 are formed over the entire surfaces of the piezoelectric material layers 201, the multilayered structure 200 is more advantageous than the multilayered structure 100 shown in FIG. 15 in expression of piezoelectric performance. Further, as described above, since the stress concentration as in the insulating regions 106 (FIG. 15) is not generated in the multilayered structure 200, the life of multilayered structure hardly becomes shorter.

However, in order to fabricate the multilayered structure 200, the insulating films 203 should be formed on every other end surface of the internal electrode layer 202 exposed at each side surface of the multilayered structure 200. Currently, the insulating films 203 is often formed by using brushing, printing, or photolithography technology, and there is a problem that the productivity is low according to those methods. Further, it is very difficult according to those methods to form insulating films on a two-dimensional array in which plural multilayered structures are arranged with narrow pitches. As another method, as disclosed in Japanese Patent Examined Application Publication JP-B2-61-32835, on exposed side end surfaces of internal electrode layer plates of electrostriction effect elements, the insulating layers are formed by electrophoresis only on the exposed parts of the internal electrode layer plates and the electrostriction materials nearby. In JP-B2-61-32835, glass is used as a material of the insulting layers. However, glass films formed by electrophoresis are aggregates of cluster particles, and they are sparse films. Accordingly, in order to obtain a sufficient withstand voltage, the thickness of the insulating layer is required to be several tens of microns. However, in the case where an ultrasonic transducer array is fabricated, it becomes a problem that ultrasonic transducers cannot be laid out with narrow pitches due to such thickness of the insulating layer.

SUMMARY OF THE INVENTION

The present invention is achieved in view of the above-mentioned problems. A first object of the present invention is to narrow pitches of a multilayered structure array by reducing thickness of coatings for insulating internal electrode layers from side electrodes. Further, a second object of the present invention is to improve the productivity of multilayered structures and multilayered structure arrays by easily forming such coatings.

In order to solve the above-mentioned problems, a multilayered structure according to one aspect of the present invention includes a first internal electrode layer; a dielectric layer formed on the first internal electrode layer; a second internal electrode layer formed on the dielectric layer; a first coating formed on an end surface of the first internal electrode layer in a first side surface region of the multilayered structure and containing one of metal oxide, metal nitride, metal fluoride and metal sulfide in at least one part thereof; and a second coating formed on an end surface of the second internal electrode layer in a second side surface region different from the first side surface region of the multilayered structure and containing one of metal oxide, metal nitride, metal fluoride and metal sulfide in at least one part thereof.

Further, a multilayered structure array according to one aspect of the present invention includes plural multilayered structures arranged in a one-dimensional manner or a two-dimensional manner, and each of the plural multilayered structures includes: a first internal electrode layer; a dielectric layer formed on the first internal electrode layer; a second internal electrode layer formed on the dielectric layer; a first coating formed on an end surface of the first internal electrode layer in a first side surface region of the multilayered structure and containing one of metal oxide, metal nitride, metal fluoride and metal sulfide in at least one part thereof; and a second coating formed on an end surface of the second internal electrode layer in a second side surface region different from the first side surface region of the multilayered structure and containing one of metal oxide, metal nitride, metal fluoride and metal sulfide in at least one part thereof.

Furthermore, a method of manufacturing a multilayered structure according to the present invention includes the steps of: (a) forming a first dielectric layer; (b) disposing a conducting material on the first dielectric layer to form a first internal electrode layer; (c) forming a second dielectric layer on the first internal electrode layer; (d) disposing a conducting material on the second dielectric layer to form a second internal electrode layer; (e) forming at least one groove in a workpiece including the first dielectric layer, the first internal electrode layer, the second dielectric layer and the second internal electrode layer formed at steps (a) to (d) to produce plural structures partially connected to one another and expose the end surfaces of the first and second internal electrode layers on a first side surface region and a second side surface region different from the first side surface region of each structure respectively, and selectively forming conducting material films on end surfaces of the first and second internal electrode layers; and (f) causing at least one part of each of the first and second conducting material films formed at step (e) to have insulation to form a first coating and a second coating.

According to the present invention, coatings containing a metal material are formed on the end surfaces of internal electrodes to be insulated from side electrodes and the coatings are caused to have insulation. Therefore, insulating films can be made further thinner while maintaining the withstand voltage thereof. Further, coatings can be easily formed on the end surfaces of internal electrodes even in a region where the distance between opposed side surfaces is narrow by using electrophoresis or magnetophoresis power. Accordingly, the plural multilayered structures in an multilayered structure array can be easily arranged with narrow pitches, and the productivity can be improved significantly for the multilayered structure, the multilayered structure array, an ultrasonic probe utilizing such a multilayered structure array as ultrasonic transducers, and so on.

BRIEF DESCRIPTION OF THE DRAWINGS

FIG. 1 is a sectional view showing a multilayered structure according to a first embodiment of the present invention;

FIG. 9 is a sectional view showing a structure of a multilayered structure according to a second embodiment of the present invention;

DESCRIPTION OF THE PREFERRED EMBODIMENTS

Figure 2A:
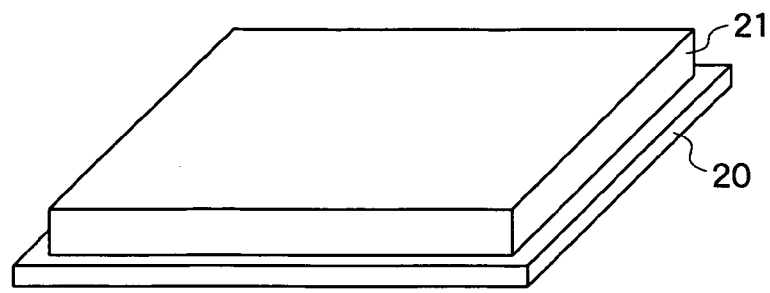
FIGS. 2A to 2C are perspective views for explanation of a method of manufacturing a multilayered structure and a multilayered structure array according to the first embodiment of the present invention.

Hereinafter, preferred embodiments of the present invention will be described in detail by referring to the drawings. The same reference numerals are assigned to the same component elements and the description thereof will be omitted.

FIG. 1 is a sectional view showing a multilayered structure according to one embodiment of the present invention. The multilayered structure 1 is a columnar structure having a bottom surface with sides on the order of 0.2 mm to 1.0 mm, for example. In the embodiment, as a dielectric material, a piezoelectric material as a ferroelectric material is used. The multilayered structure 1 includes plural piezoelectric material layers 10, plural internal electrode layers 11a and 11b, and coatings 12 formed on one ends of the respective internal electrode layers 11a and 11b. Further, the multilayered structure 1 may include two side electrodes 13a and 13b formed on the side surfaces of the stacked plural piezoelectric material layers 10. Furthermore, the multilayered structure 1 may include an upper electrode 14 and a lower electrode 15 formed as external electrodes on upper and lower bottom surfaces of the stacked plural piezoelectric material layers 10, respectively. As shown in FIG. 1, the upper electrode 14 is connected to one side electrode 13b and the lower electrode 15 is connected to the other side electrode 13a. The shape of the bottom of the multilayered structure 1 is not limited to a square, but rectangular or other shapes may be adopted. Further, in the embodiment, although the side electrodes are disposed on opposed two side surfaces 1a and 1b, the regions in which the side electrodes are disposed are not limited to two opposed side surfaces as long as they are electrically insulated from each other.

Each piezoelectric material layer 10 is a piezoelectric material film having a thickness on the order of 100 μm. In the embodiment, PZT (Pb(lead) zirconatetitanate) as a binary solid solution containing $PbZrO_3$ and $PbTiO_3$ as principal chemical compositions is used as the piezoelectric material. Further, a ternary or above solid solution (called as relaxer material) formed by adding at least one of $Pb(Mg_{1/3}Nb_{2/3})O_3$, $Pb(Ni_{1/3}Nb_{2/3})O_3$, $Pb(Zn_{1/3}Nb_{2/3})O_3$ as a third component to such a binary solid solution may be used. Alternatively, as the piezoelectric material, PLZT (lanthanum-doped lead zirconate titanate) formed by adding lanthanum oxide to PZT, or a non-lead piezoelectric material such as $KNbO_3$ or bismuth series material may be used. Further, the piezoelectric material layer 10 may contain not only those principal components but also elements such as germanium (Ge), silicon (Si), lithium (Li), bismuth (Bi), boron (B), and lead (Pb), which are contained in auxiliaries to be used for growing crystals by heat treatment.

Each of the internal electrode layers 11a and 11b has a thickness of about 2 μm. As the internal electrode layers 11a and 11b, hardly-oxidizable conducting materials may be desirably used, and platinum (Pt) is used in the embodiment.

Further, each of the coatings 12 is a film having a thickness of about 10 μm, and provided for insulating the internal electrode layers 11a and 11b from the side electrodes 13a and 13b, respectively. The coatings 12 are formed by forming films of a conducting material by using an electrodeposition method on predetermined end surfaces of the internal electrode layers 11a and 11b, and then, causing the films to have insulation by oxidizing them. Accordingly, at least the surfaces of the coatings 12 (surfaces in contact with the side electrodes 13a or 13b) are covered by metal oxide as an insulating material. In the embodiment, nickel (Ni) is used as the conducting material as a raw material of the coatings 12, and at least the surfaces of the coatings 12 are nickel oxide. Although the entire regions of the coatings 12 have been made to have insulation in FIG. 1, the conducting material may be left inside of the coatings 12. Here, the electrode position method includes an electroplating, or a deposition method utilizing electrophoresis power.

On the side surface 1a of the multilayered structure 1, the end surfaces of the internal electrode layers 11a are covered by the coatings 12, and, on the side surface 1b of the multilayered structure 1, the end surfaces of the internal electrode layers 11b are covered by the coatings 12. Thereby, the internal electrode layers 11a are insulated from the side electrode 13a located on the side surface 1a, and the internal electrode layers 11b are insulated from the side electrode 13b located on the side surface 1b. Since the electrodes of the multilayered structure are thus formed, the stacked plural layers are electrically connected in parallel.

By applying a voltage between the internal electrode layers 11a and 11b so that electric fields are applied to the respective piezoelectric material layers 10, the respective piezoelectric material layers 10 expand and contract by the piezoelectric effect. The multilayered structures employing such piezoelectric material layers as dielectric layers can be used for piezoelectric pumps, piezoelectric actuators, ultrasonic transducers for transmitting and receiving ultrasonic waves in an ultrasonic probe, and so on. Further, in the structure having the multilayered structure as described above, since areas of the opposed electrodes can be made larger than that in a single layer structure, electrical impedance can be made lower. Therefore, compared to the single layer structure, the multilayered structure operates more efficiently for the applied voltage.

Next, a method of manufacturing a multilayered structure and a multilayered structure array according to a first embodiment of the present invention will be described by referring to FIGS. 2A to 6C. FIGS. 2A to 6C are diagrams for explanation of the method of manufacturing a multilayered structure and a multilayered structure array according to the embodiment.

First, a workpiece in which plural piezoelectric material layers and plural electrode layers are stacked is fabricated. For the purpose, as shown in FIG. 2A, a piezoelectric material layer 21 is formed on a substrate 20. In this regard, in the embodiment, the aerosol deposition (AD) method is used. The AD method is a deposition method of spraying a raw material powder on a foundation layer at a high speed and depositing the raw material powder thereon, and also referred to as a gas deposition method, jet printing system, or injection deposition method.

Figure 7:
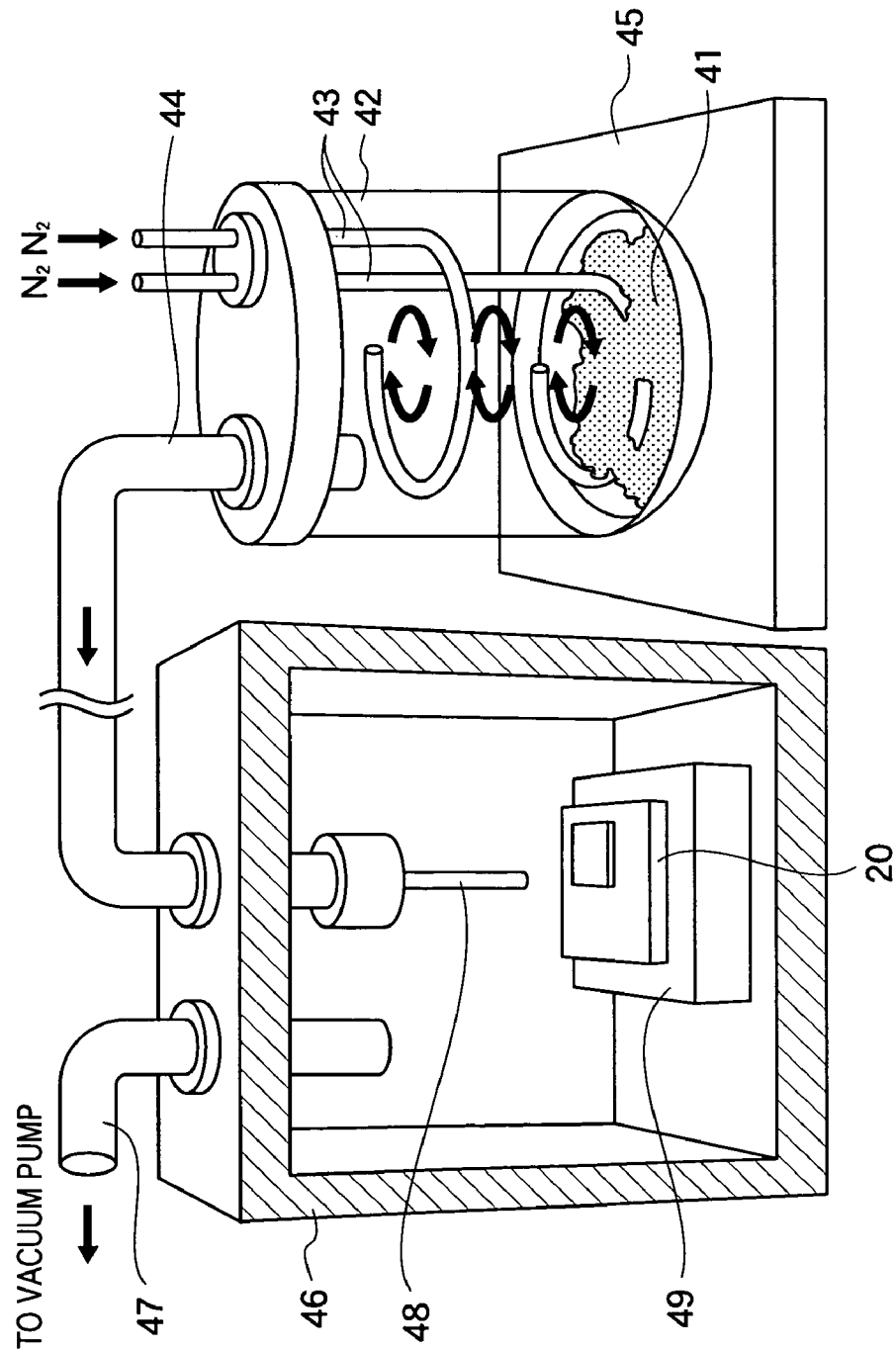
FIG. 7 is a schematic diagram showing a configuration of a film forming device using an aerosol deposition method.

FIG. 7 is a schematic diagram showing a film forming device by using the AD method. This film forming device has an aerosol generating container 42 in which a raw material powder 41 is placed. Here, an aerosol refers to fine particles of a solid or liquid floating in a gas. In the aerosol generating container 42, a carrier gas lead-in part 43, an aerosol lead-out part 44, and a vibrating part 45 are provided. The carrier gas lead-in part 43 introduces a gas such as a nitrogen gas ($N_2$), and thereby, the raw material powder placed in the aerosol generating container 42 is blown up to generate the aerosol. Simultaneously, the vibrating part 45 applies vibration to the aerosol generating container 42, and thereby, the raw material powder is agitated and the aerosol is efficiently generated. The generated aerosol is guided to a film forming chamber 46 through the aerosol lead-out part 44.

In the film forming chamber 46, an exhaust pipe 47, a nozzle 48, and a movable stage 49 are provided. The exhaust pipe 47 is connected to a vacuum pump and exhausts air from the film forming chamber 46. The nozzle 48 sprays the aerosol generated in the aerosol generating container 42 and introduced through the aerosol lead-in part 44 into the film forming chamber 46 toward the substrate 20. The substrate 20 is mounted on the movable stage 49 that is movable in a three-dimensional manner, and the relative position between the substrate 20 and the nozzle 48 is adjusted by controlling the movable stage 49. The particles (raw material powder) injected from the nozzle 48 and accelerated to a high speed with high kinetic energy collide against the substrate 20 are deposited thereon. It is thought that, at this time, the chemical reaction called mechanochemical reaction is caused by the collision energy of particles, and the particles are strongly attached to the substrate or previously formed films by the reaction. As the substrate 20, glass, quartz, ceramics such as PZT, metal such as SUS may be used, and glass is used in the embodiment.

As the raw material 31, for example, a PZT monocrystal powder having an average particle diameter of 0.3 µm is mixed in auxiliaries such as germanium, silicon, lithium, bismuth, boron, and lead used for growing crystals by heat treatment according to need and placed within the aerosol generating container 42 shown in FIG. 7, and the film forming device is driven. Thereby, the piezoelectric material layer 21 as shown in FIG. 2A is formed on the substrate 20.

Figure 2B:
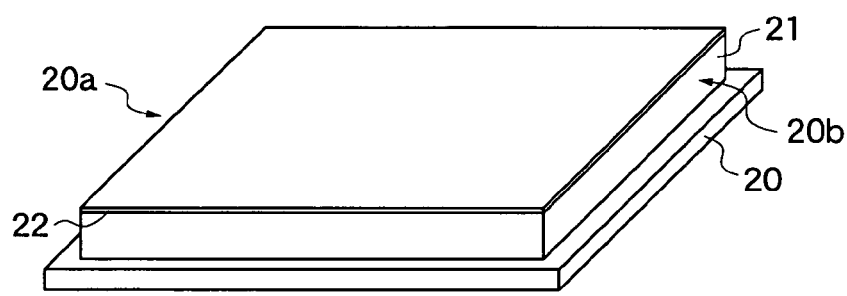

Then, as shown in FIG. 2B, a platinum layer of about 2 µm as an electrode layer 22 is formed by sputtering or vacuum deposition on the piezoelectric material layer 21. The thickness of the electrode layer 22 is desirably 200 nm or more, and more preferably, 300 nm or more. The reason is that, in the case where the piezoelectric material layer is formed by the AD method on the electrode layer 22, because a phenomenon called anchoring that the raw material powder cuts into the foundation layer occurs when the powder is sprayed on the foundation layer, considering the typical depth of anchoring on the order of 10 nm to 300 nm, the thickness at the above degree is required such that it may function as an electrode layer.

Figure 2C:
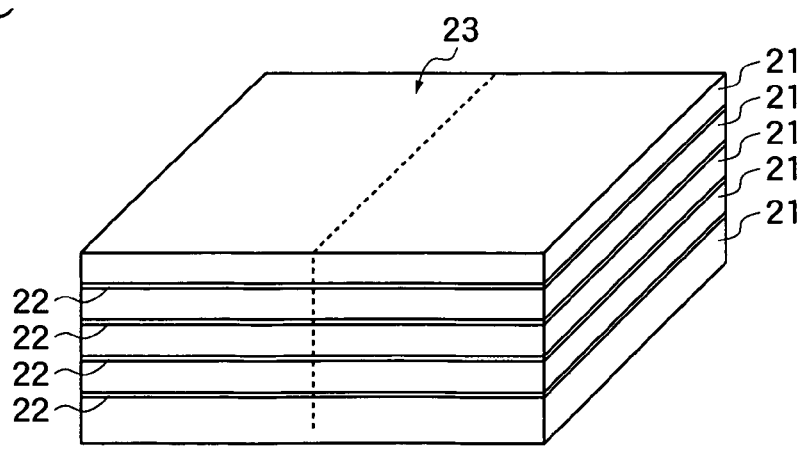

Further, the formation of the piezoelectric material layer 21 shown in FIG. 2A and the formation of the electrode layer 22 shown in FIG. 2B are repeated at required times and the piezoelectric material layer 21 is formed at the uppermost layer, and thereby, a workpiece 23 shown in FIG. 2C is formed. Here, the thickness of the lowermost piezoelectric material layer 21 is made thicker than that of the other piezoelectric material layers 21 that will be formed later. For example, the thickness of the lowermost piezoelectric material layer 21 is about 1000 µm or ten times that of the other piezoelectric material layers 21 (e.g., about 100 µm).

Subsequently, the substrate 20 is removed by grinding or peeling from the workpiece 23. Afterwards, a heat treatment step of the workpiece 23 at predetermined temperature (e.g., about 500° C. to 1000° C.) may be provided in order to improve the piezoelectric performance by enlarging grain size of PZT contained in the piezoelectric material layers.

Figure 3A:
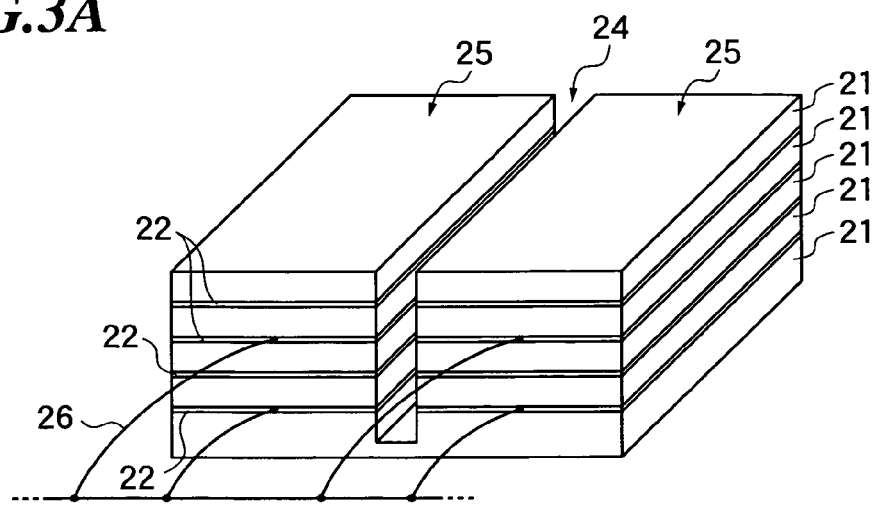
FIGS. 3A to 3C are perspective views for explanation of the method of manufacturing the multilayered structure and the multilayered structure array according to the first embodiment of the present invention.

Furthermore, by dicing the work piece with a predetermined pitch to a predetermined depth in the direction shown by a broken line in FIG. 2C, a groove 24 is formed and the workpiece 23 is separated into plural structures 25 that are partially connected to one another as shown in FIG. 3A. The width of the groove 24 is made substantially equal to the element interval (e.g., about 50 µm) of the multilayered structure array to be fabricated. The outer side surface of the workpiece 23 and the side surface newly exposed as the groove 24 are formed make become surfaces on which the coatings 12 (FIG. 1) are to be formed. At the time of dicing, the contour of the workpiece 23 or structure 25 may be shaped such that the end surfaces of the electrode layers 22 may be positively exposed on the side surfaces.

Figure 3B:
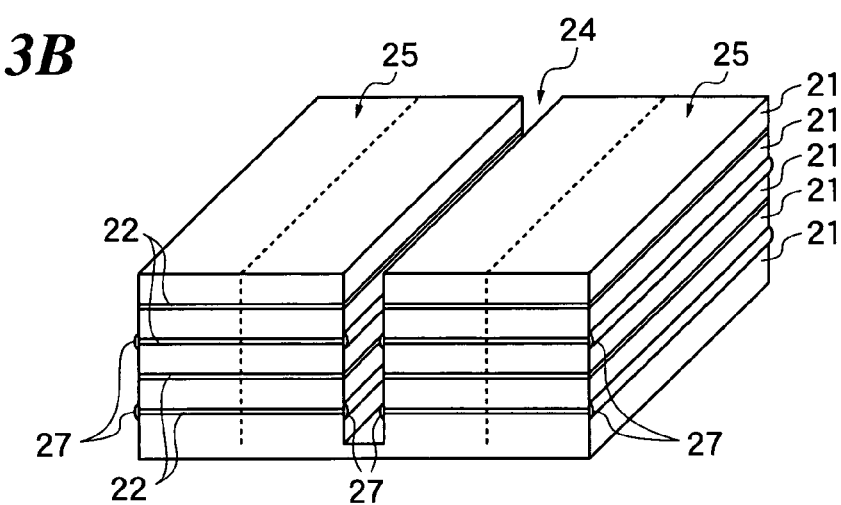

Then, in the structure 25, metal coatings are selectively formed on predetermined end surfaces of the plural electrode layers 22. As a material of coatings, a relatively easily-oxidizable metal is used, and nickel (Ni) is used in the embodiment. As shown in FIG. 3A, interconnections 26 are formed on the end surfaces of the electrode layers 22 by using a method such as wire bonding or solder joint from every other layer in each structure 25 as shown in FIG. 3A. The surface on which the interconnections are formed is desirably a surface other than the surface on which the coatings 12 are to be formed, and they are formed on the front side surface in the drawing in the embodiment. Then, electroplating is performed using a plating solution containing nickel ions to attach nickel to the end surfaces of the electrode layers 22 on which the interconnections 26 have been formed. Thus, as shown in FIG. 3B, nickel coatings 27 of about 10 µm are formed on each structure 25. Then, the interconnections 26 are removed.

Figure 3C:
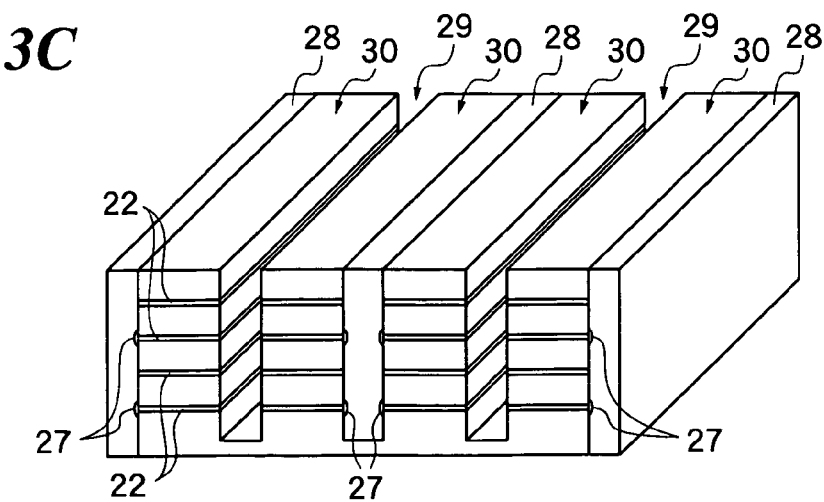

Then, as shown in FIG. 3C, the outer part and the groove 24 of the plural structures 25, on which the nickel coatings 27 have been formed, are filled with an epoxy resin 28 and the resin is cured. Thereby, the side surfaces on which the nickel coatings 27 have been formed are protected. Then, a groove 29 is formed in each structure 25 by performing dicing in the direction of the broken line shown in FIG. 3B, and plural rectangular structures 30 that are partially connected to one another are formed. In each structure 30, new end surfaces of the electrode layers 22 are exposed by the groove 29.

Figure 4A:
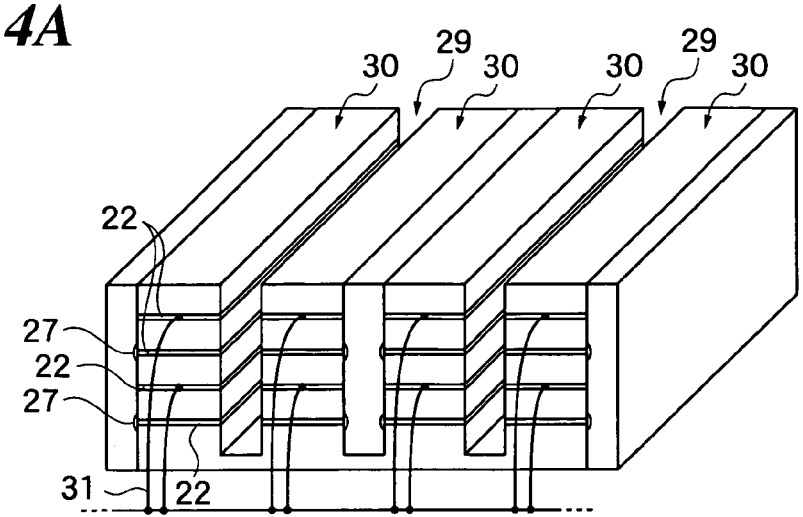
FIGS. 4A to 4C are perspective views for explanation of the method of manufacturing the multilayered structure and the multilayered structure array according to the first embodiment of the present invention.
Figure 4B:
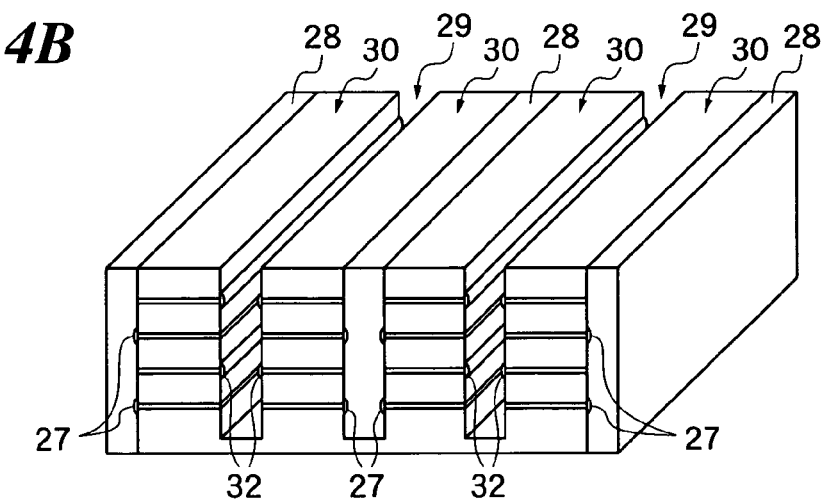

Then, in the structure 30, nickel coatings are selectively formed on predetermined end surfaces of the plural electrode layers 22. As shown in FIG. 4A, in each structure 30, interconnections 31 are formed on the end surfaces of the electrode layers 22, on which the nickel coating 27 is not formed, by using a method such as wire bonding or solder joint. Then, electroplating is performed by using a plating solution containing nickel ions to attach nickel to the end surfaces of the electrode layers 22 on which the interconnections have been formed. In this regard, since the surfaces on which the nickel coatings 27 have been previously formed are covered by the epoxy resin 28, no film is formed on the end surfaces of the electrode layers 22 even if the interconnections 31 are formed. Thus, as shown in FIG. 4B, nickel coatings 32 of about 10 µm are formed on each structure 30. Then, the interconnections 31 are removed.

Figure 4C:
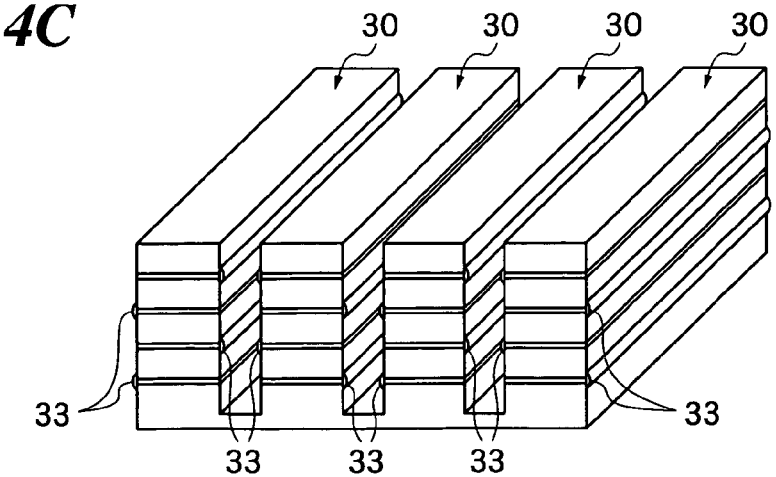

Then, the plural structures 30 are immersed in an organic solvent such as acetone to dissolve the epoxy resin 28. Thereby, plural structures 30 in which nickel coatings 27 and 32 have been formed in a staggered manner on the plural electrode layers 22 are obtained. Further, the nickel coatings 27 and 30 are oxidized by heat treating the plural structures 30 for 30 minutes in air in an atmosphere at 800° C. Thereby, the plural structures 30 on which insulating films 33 have been formed are obtained as shown in FIG. 4C. The heat treatment on the piezoelectric material layers may be simultaneously performed by controlling the temperature and time of that heat treatment.

Figure 5A:
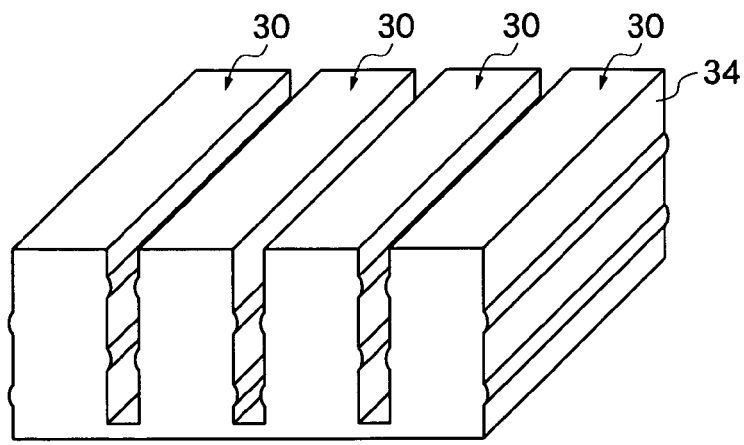
FIGS. 5A to 5C are perspective views for explanation of the method of manufacturing the multilayered structure and the multilayered structure array according to the first embodiment of the present invention.
Figure 5B:
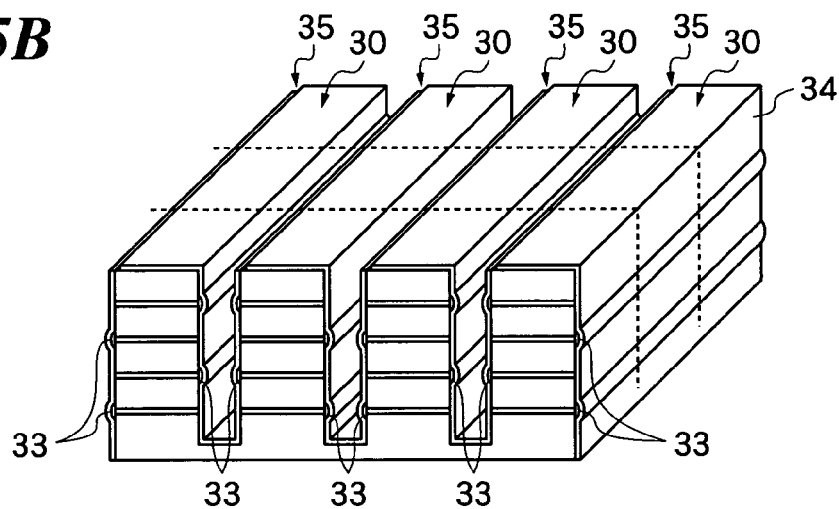

Then, as shown in FIG. 5A, platinum films 34 of about 3 µm are formed around the structures 30 by performing electroless platinum plating on the plural structures 30 on which the insulating films 33 have been formed. Furthermore, as shown in FIG. 5B, insulating regions 35 are formed by dicing and removing parts of the platinum films 34 that have been formed on the top surfaces of the structures 30 near the one surfaces on which the insulating films 33 have been formed. Further, the platinum films 34 formed on the side surfaces of the structures 33 on which no insulating film 33 has been formed (surfaces at the front side and the opposite side in the drawing) are removed by grinding. The platinum films 34 left thereby are used as two side electrodes and used as upper electrodes connected to one side electrode and insulated from the other side electrode.

Figure 5C:
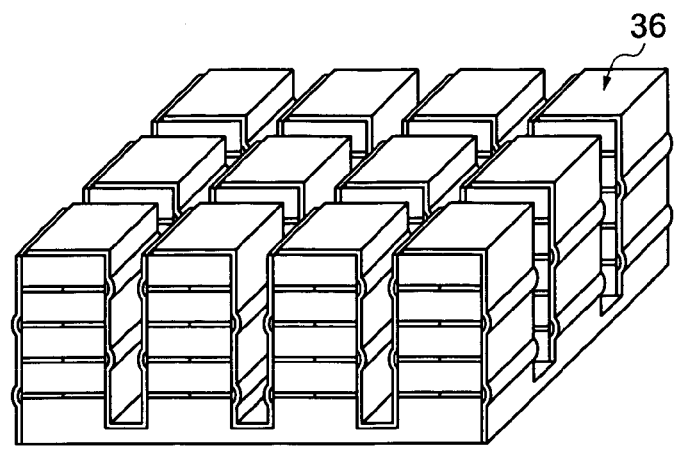

Then, dicing is performed in the direction of the broken lines shown in FIG. 5B (the direction perpendicular to the longitudinal sides of the rectangular shapes) to a predetermined depth. Thereby, as shown in FIG. 5C, plural multilayered structures 36 that are partially connected are obtained. In this regard, the bottom surface of each multilayered structure 36 can be made to have a square form by setting the pitch and width of dicing nearly equal to those formed between the plural structures 30.

Figure 6A:
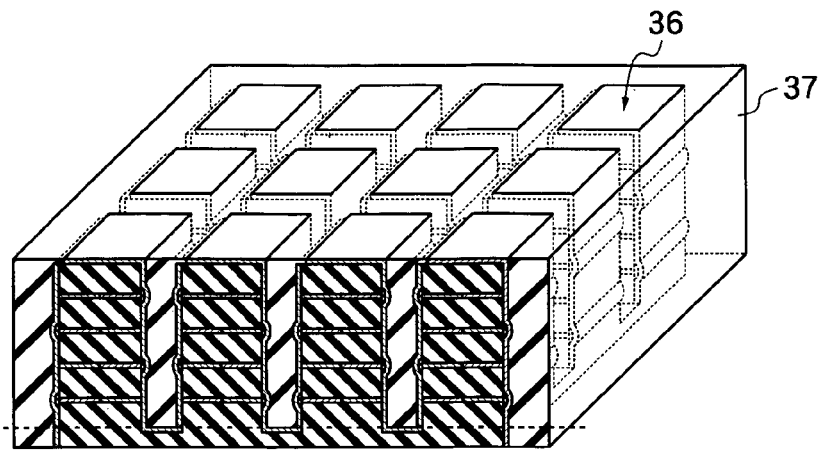
FIGS. 6A to 6C are partially sectional perspective views for explanation of the method of manufacturing the multilayered structure and the multilayered structure array according to the first embodiment of the present invention.

Then, the grooves formed between the plural multilayered structures 36 and surrounding parts are filled with a filling material such as an epoxy resin 37 and the material is cured as shown in FIG. 6A. As the filling material, urethane resin, silicone rubber, or the like may be used other than that. Then, the lower parts of the plural multilayered structures 36 in the drawing are ground to the region shown by a broken line. Thereby, the end surfaces of the piezoelectric material layers and side electrodes of each multilayered structure 36 are exposed on the lower bottom surface of the epoxy resin 37. Since the plural multilayered structures 36 are fixed by the epoxy resin 37, the matrix arrangement shown in the drawing is never out of alignment.

Figure 6B:
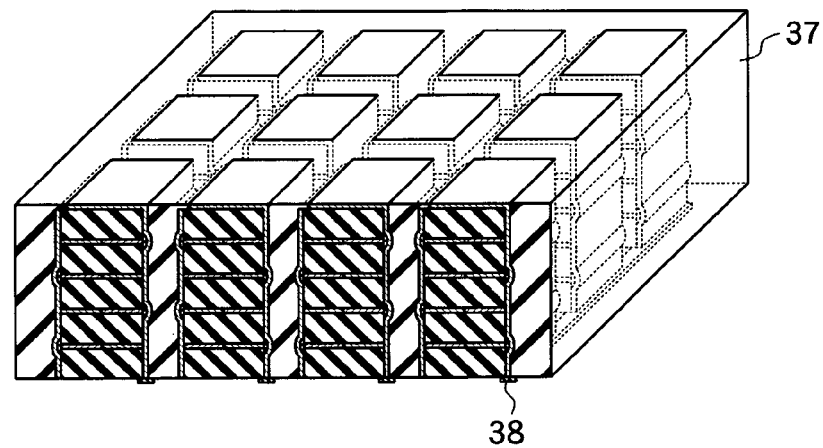

Then, as shown in FIG. 6B, insulating films 38 are formed at the bottom surface of the epoxy resin 37 so as to cover the end surfaces of the side electrodes at the side where they are connected to the upper electrodes. For this purpose, for example, silicon oxide films ($SiO_2$) may be formed by sputtering using a metal mask. The insulating films 38 are for insulating the side electrodes from a common electrode, which will be formed later, and may be formed continuously between elements having side electrodes to be insulated within the same plane.

Figure 6C:
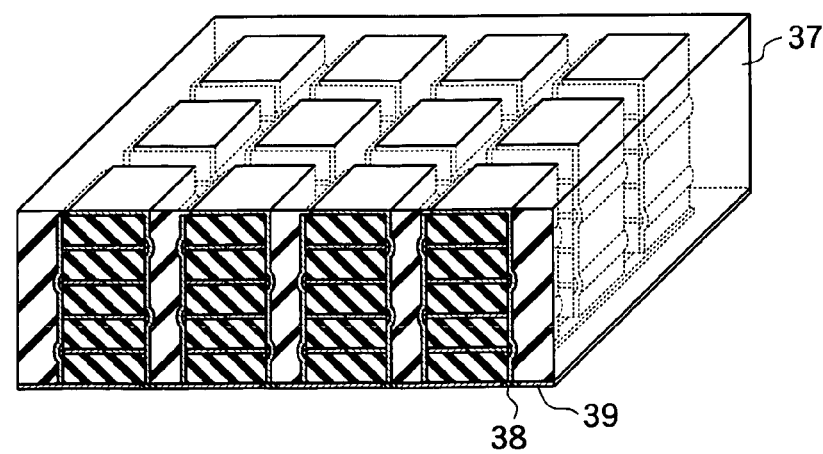

Further, as shown in FIG. 6C, a common electrode 39 is formed by forming a film of gold (Au) by sputtering, for example, at the bottom surface of the epoxy resin 37. In this regard, the regions of the insulating films 38 may be excluded from the film forming region by using a metal mask.

Thus, a multilayered structure array (1-3 composite) 2 including plural multilayered structures 1 (FIG. 1) arranged in a two-dimensional manner can be manufactured.

In the case where a single multilayered structure is fabricated, the lower part of the plural multilayered structures 36 fixed by the epoxy resin 37 are ground as shown in FIG. 6A, and then, the plural multilayered structures 36 are separated from one another by dissolving the epoxy resin using an organic solvent. According to need, lower electrodes or insulating films 38 shown in FIG. 6B may be formed before dissolving the epoxy resin.

Furthermore, according to a similar method, a multilayered structure array including plural multilayered structures 1 arranged in a one-dimensional manner can be also manufactured.

In the embodiment, dicing has been performed in the direction perpendicular to the longitudinal sides of the rectangular shapes as shown in FIG. 5C. However, the direction may not be the perpendicular direction as long as each multilayered structure after separation includes two side electrodes.

Further, in the embodiment, the piezoelectric material layers in the workpiece 23 have been formed by using the AD method. However, the same work piece can be fabricated by stacking PZT plate materials on which the metal thin films as electrode layers have been formed or stacking the PZT thick films and electrode layers using other methods than the AD method (e.g., green sheet method).

Next, another method of manufacturing the multilayered structure and the multilayered structure array according to the embodiment will be described.

As shown in FIG. 5B, after the upper electrodes and side electrodes are formed on the plural structures 30, the surrounding parts of the plural structures 30 and the grooves between the structures are filled with an epoxy resin and the resin is cured. The plural structures 30 are separated from one another by grinding the lower part of the plural structures 30. Further, in the same way as have been described using FIG. 6B, insulating films are formed on the end surfaces of one side electrodes exposed on the lower bottom surface of the epoxy resin, and further, a common electrode is formed. Thereby, a multilayered structure array in which plural rectangular multilayered structures are arranged in a one-dimensional manner can be fabricated.

Further, in order to fabricate a single rectangular multilayered structure, as shown in FIG. 5B, after the upper electrodes and the side electrodes are formed on the plural structures 30, the surrounding parts of the plural structures 30 and the grooves between the structures are filled with an epoxy resin and the resin is cured. As the filling material, urethane resin, silicone rubber, or the like may be used other than that. Further, the lower part of the plural structures are ground 30 and the plural structures 30 may be separated from one another, and then, the epoxy resin is dissolved by an organic solvent. In this regard, according to need, lower electrodes or insulating films 38 shown in FIG. 6B may be formed before dissolving the epoxy resin.

As described above, in the embodiment, the coatings formed on the side regions of the multilayered structure for insulating the side electrodes from the internal electrode layers are formed by forming films of a conducting material using an electrodeposition method and oxidizing the films. That is, since dense metal oxide covers the end surfaces of the internal electrodes, even the insulating films are as thin as about 10 µm, sufficient insulation performance can be exerted. Further, since the film thickness can be controlled, narrow pitch arrangement in a multilayered structure can be easily accommodated.

Figure 8:
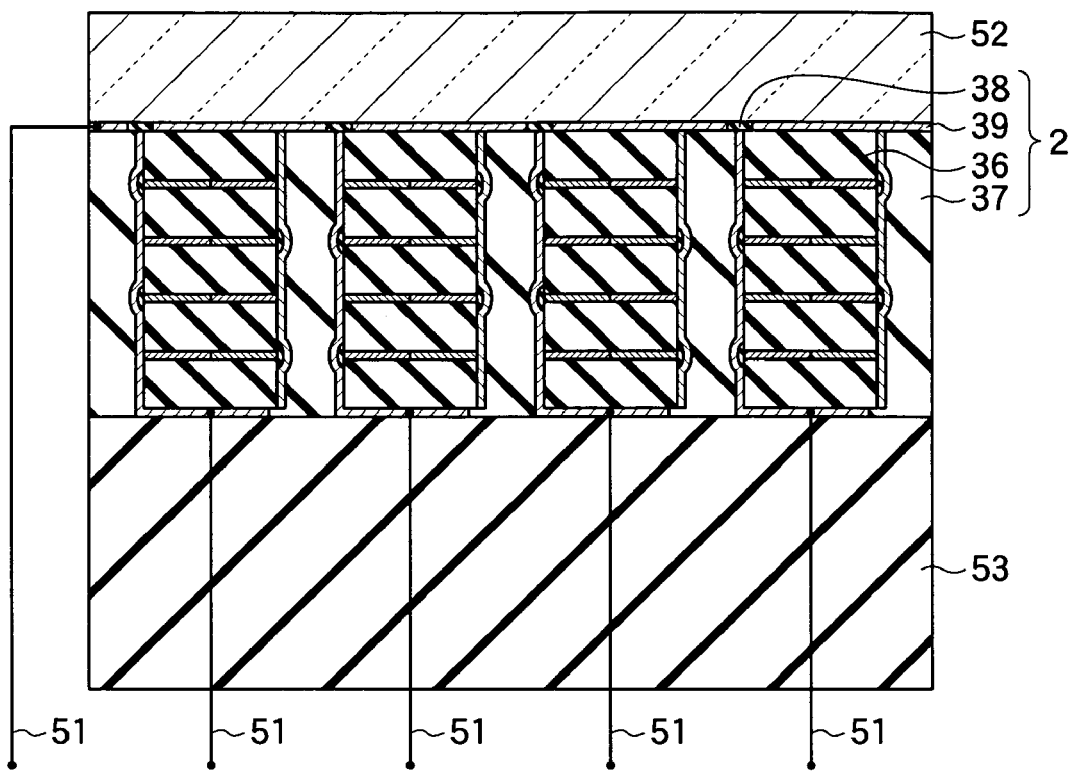
FIG. 8 is a sectional view showing a structure of an ultrasonic probe using the multilayered structure array shown in FIG. 6C.

FIG. 8 is a sectional view showing an ultrasonic probe using the multilayered structures according to the embodiment as an ultrasonic transducer array. As shown in FIG. 8, this ultrasonic probe includes a multilayered structure array 2 shown in FIG. 6C, interconnections 51 drawn from the multilayered structure array 2, an acoustic matching layer 52 of Pyrex glass or the like disposed at one bottom surface side (e.g., the common electrode 39 side) of the multilayered structure array 2, and a backing material 53 of an epoxy resin containing metal powder or the like disposed at the other bottom surface side. In FIG. 8, a casing for accommodating the ultrasonic probe is omitted.

Since the electrical impedance can be lowered and impedance matching with a transmitting and receiving circuit can be improved using the above-mentioned multilayered structures as ultrasonic transducers used for an ultrasonic probe, application efficiency of voltage can be improved and detection sensitivity of ultrasonic waves can be made higher. Further, since the number of ultrasonic transducers to be mounted can be increased by narrowing the pitches of element arrangement in the ultrasonic transducer array, scanning density of ultrasonic waves can be made higher and the transmission and reception directions can be controlled more precisely. Therefore, the image quality of ultrasonic images can be improved by making solving power higher. Alternatively, the entire ultrasonic probe can be downsized while maintaining the conventional ultrasonic transmission and reception performance.

Next, a multilayered structure according to a second embodiment of the present invention will be described.

FIG. 9 is a sectional view showing a structure of the multilayered structure according to the second embodiment. This multilayered structure 3 has internal electrodes 11a and 11b in the multilayered structure 1 shown in FIG. 1 and, in place of the coatings 12, internal electrodes 61a and 61b and coatings 62. Other constitution is the same as that of the multilayered structure 1 shown in FIG. 1.

In the embodiment, the coatings 62 are formed by forming films of a conducting material on predetermined end surfaces of the internal electrode layers 61a and 61b, and then, making the films to have insulation by oxidizing them. However, the method of forming coatings differs from the method in the first embodiment. That is, in the embodiment, films are formed on the end surfaces of the internal electrode layers using magnetophoresis power in place of electrophoresis power. For this purpose, in each of the internal electrode layers 61a and 61b, conducting materials of different types are disposed such that a conducting material (first conducting materials 63) having magnetism extends to a side surface on which the coatings 62 are to be formed and a conducting material (second conducting materials 64) having no magnetism extends to a side surface on which the coatings 62 are not to be formed. Further, as a raw material of the coatings 62 before insulation, a conducting material having magnetism is used.

Figure 10A:
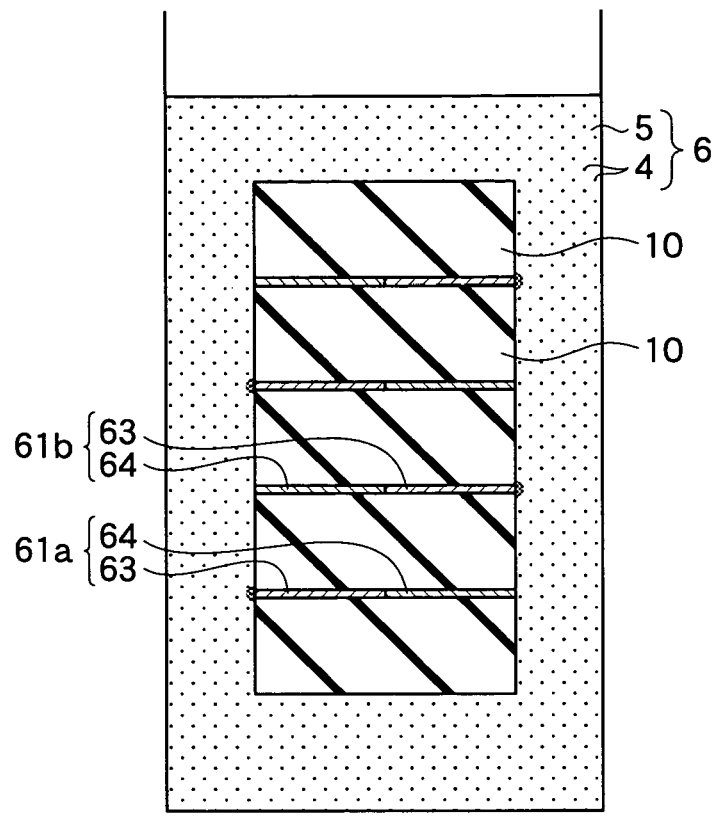
FIGS. 10A and 10B are diagrams for explanation of a principle of a method of forming a magnetic film.
Figure 10B:
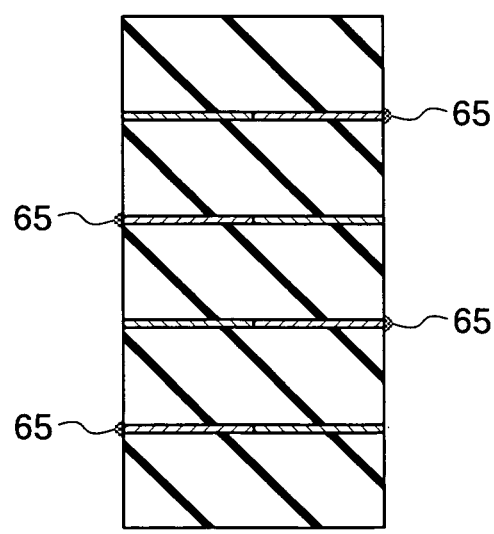

FIGS. 10A and 10B are diagrams for explanation of a principle of a method of forming insulating films by magnetophoresis. In a container shown in FIG. 10A, a suspension 6 in which particles of a conducting material having magnetism (hereinafter, referred to as magnetic particles) 4 are dispersed in a liquid 5 is placed. As the liquid 5, in order to smoothly cause the migration, a liquid having relatively low viscosity such as water, alcohol, toluene, or xylene is desirably used.

A laminated structure including plural piezoelectric material layers 10 and internal electrode layers 61a and 61b is put into the suspension 6. As a result, the magnetic particles 4 are attracted by the first conducting materials 63 having magnetism according to the magnetophoresis power, and adhere to the end surfaces of the first conducting materials 63. Thereby, as shown in FIG. 10B, the magnetic films 65 can be selectively formed on one end surfaces of the respective internal electrode layers 61a and 61b.

As the first conducting material 63 (magnetic conducting material) and the magnetic particle 4 (magnetic conducting material), the following combinations (A) to (C) are conceivable.

(A) spontaneous magnetization film as the first conducting material 63 and single magnetic domain particle as the magnetic particle 4

(B) spontaneous magnetization film as the first conducting material 63 and multiple magnetic domain particle as the magnetic particle 4

(C) multiple magnetic domain film as the first conducting material 63 and single magnetic domain particle as the magnetic particle 4

In the case of using the combination (A), the magnetic particle 4 can be attached to the first conducting material 63 relatively strongly. Further, in the case of using the combination (B), the handling of the magnetic particles 4 when the suspension 6 is prepared is easy, and the power of migration is high and practical. Furthermore, in the case of using the combination (C), the step of placing the first conducting material 63 on the piezoelectric material layer 10 can be simplified. When the materials are determined, an appropriate combination may be selected in consideration of the size and shape of multilayered structure, the compatibility with the raw material of piezoelectric material layer, the manufacturing facility, or the like. Especially, it is necessary to note the relationship between heat treatment temperature for oxidizing the magnetic films 65 later and Curie points of the first conducting material 63 and the magnetic particle 4.

As the first conducting material 63, transition metal such as manganese (Mn), iron (Fe), cobalt (Co), and nickel (Ni) and a material containing them, or rare earth such as neodium (Nd) and samarium (Sm) and a material containing them is used. Specifically, a conducting material having magnetism such as iron-cobalt (permendur) alloy, samarium-cobalt alloy, neodium-iron-boron alloy, or tungsten steel is used. Further, as the second conducting material 64, a hardly-oxidizable non-magnetic material such as gold (e.g., Au) or platinum (e.g., Pt) is used. Furthermore, as the magnetic particle 4, a relatively easily-oxidizable magnetic material such as iron or nickel is used. In the embodiment, a combination of tungsten steel as the first conducting materials 63, platinum as the second conducting materials 64, and iron (Fe) as the magnetic particle 4 is adopted. It is desirable that the particle diameter of the magnetic particle 4 is made as small as possible so as to evenly cover the end surfaces of the internal electrode layers 61a and 61b (e.g. about 1 μm or less).

Next, a method of manufacturing the multilayered structure and the multilayered structure array according to the second embodiment of the present invention will be described by referring to FIGS. 11A to 13.

Figure 11A:
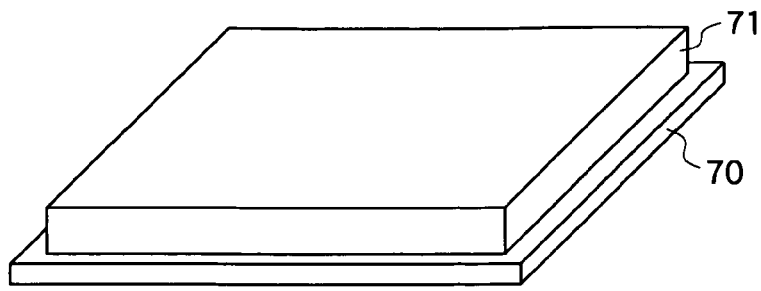
FIGS. 11A to 11D are perspective views for explanation of a method of manufacturing the multilayered structure and a multilayered structure array according to the second embodiment of the present invention.

First, a workpiece, in which plural piezoelectric material layers and internal electrode layers each containing two kinds of conducting materials are stacked, is fabricated. For this purpose, a piezoelectric material layer 71 is formed on a substrate 70 using the AD method as shown in FIG. 11A.

Figure 11B:
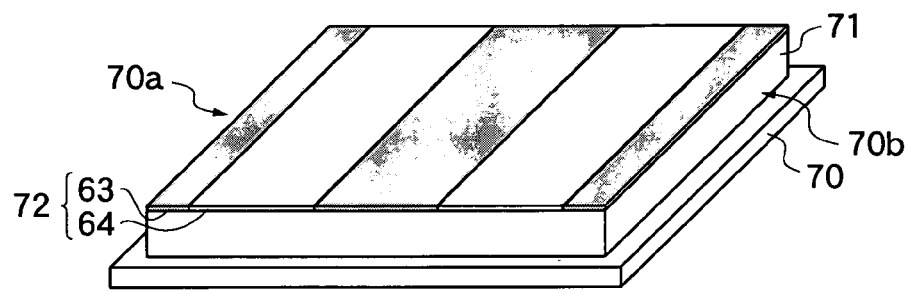
Figure 11C:
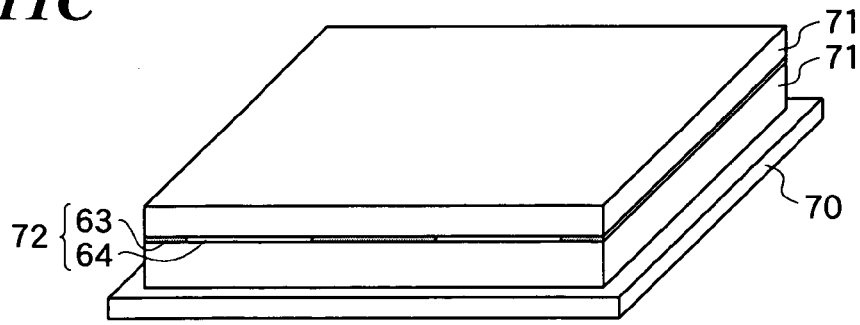

Then, as shown in FIG. 11B, an electrode layer 72 is formed by alternately disposing the first conducting materials 63 and the second conducting materials 64 in band forms on the piezoelectric material layer 71. For this purpose, first, films of the first conducting materials 63 (tungsten steel) are formed by performing sputtering in the magnetic field using a metal mask in which slit-like openings have been formed at substantially equal widths and intervals to the width of the multilayered structure 3. Then, films of the second conducting materials (platinum) 64 are formed by performing sputtering or vacuum deposition using the metal mask after shifting the substrate 70 by a distance substantially equal to the width of the multilayered structure 3. By the way, as shown in FIG. 11B, the widths of the first conducting materials 63 and the second conducting materials 64 may be made narrower than the width of the multilayered structure 3 at both ends of the electrode layer 72. Here, in order to form a spontaneous magnetization film as the first conducting material, not only the above-mentioned magnetic orientation film formation, but also epitaxial growth utilizing crystal magnetic anisotropy and shape magnetic anisotropy may be performed.

Then, as shown in FIG. 1C, the piezoelectric material layer 71 is formed using AD method on the electrode layer 72.

Then, as shown in FIG. 1D, an electrode layer 73 is formed by alternately disposing the first conducting materials 63 and the second conducting materials 64 in band forms on the piezoelectric material layer 71. In this regard, the locational relationship between the first conducting materials 63 and the second conducting materials 64 is made opposite to the locational relationship between them in the electrode layer 72. The method of forming the first conducting materials 63 and the second conducting materials 64 is the same as that in the electrode layer 72.

Figure 11D:
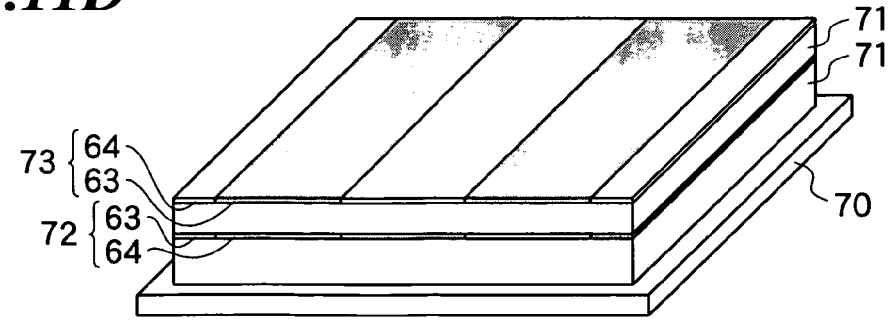
Figure 12A:
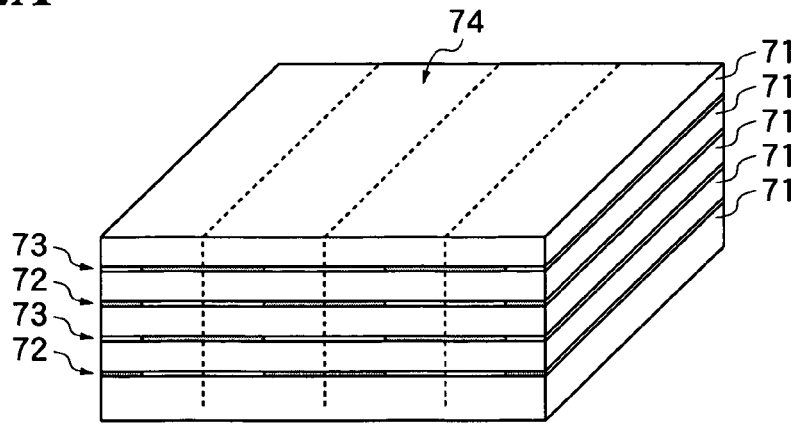
FIGS. 12A to 12C are perspective views for explanation of the method of manufacturing the multilayered structure and the multilayered structure array according to the second embodiment of the present invention.

Furthermore, the steps shown in FIGS. 11A to 11D are repeated at required times and the piezoelectric material layer 71 is formed on the uppermost position, and thereby, a workpiece 74 shown in FIG. 12A is formed. Subsequently, the substrate 70 is removed by grinding or peeling from the workpiece 74. A heat treatment step of the workpiece 74 at predetermined temperature (e.g., 500° C. to 1000° C.) may be provided afterwards in order to improve the piezoelectric performance by enlarging grain size of PZT contained in the piezoelectric material layers.

Figure 12B:
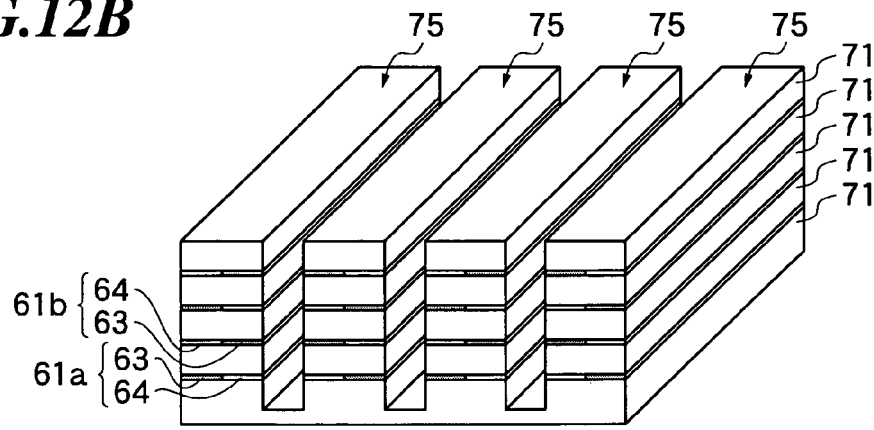

Then, as shown by broken lines in FIG. 12A, the workpiece 74 is separated into plural rectangular structures that are partially connected by dicing the workpiece at the substantially central parts of the first conducting materials 63 and substantially central part of the second conducting materials 64 in the longitudinal direction of the conducting materials. As shown in FIG. 12B, in the respective rectangular structures 75, the locational relationships between the first conducting materials 63 and the second conducting materials 64 in the internal electrode 61a and the internal electrode 61b are opposite to each other. At the time of dicing, the contour of the workpiece 74 may be shaped such that the end surfaces of the first conducting materials 63 and the second conducting materials 64 may be positively exposed on the side surfaces of the workpiece 74.

Figure 12C:
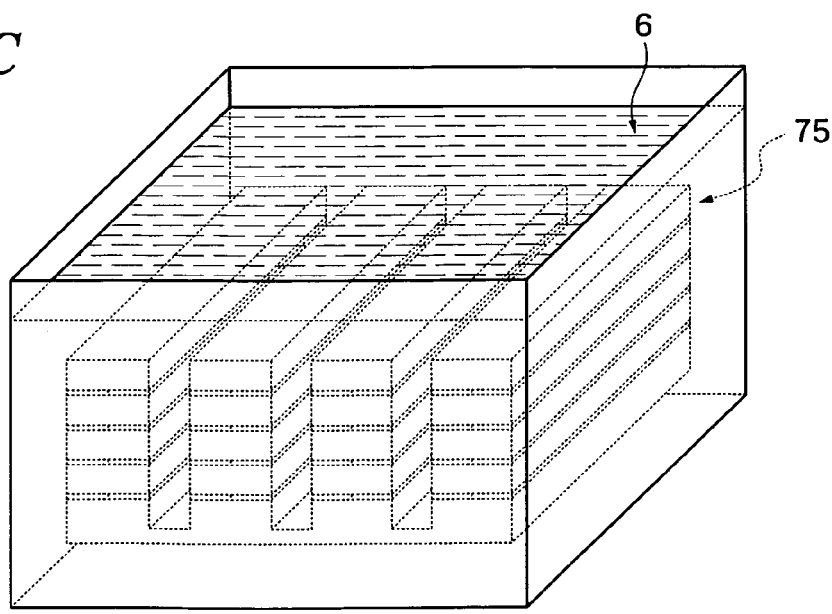
Figure 13:
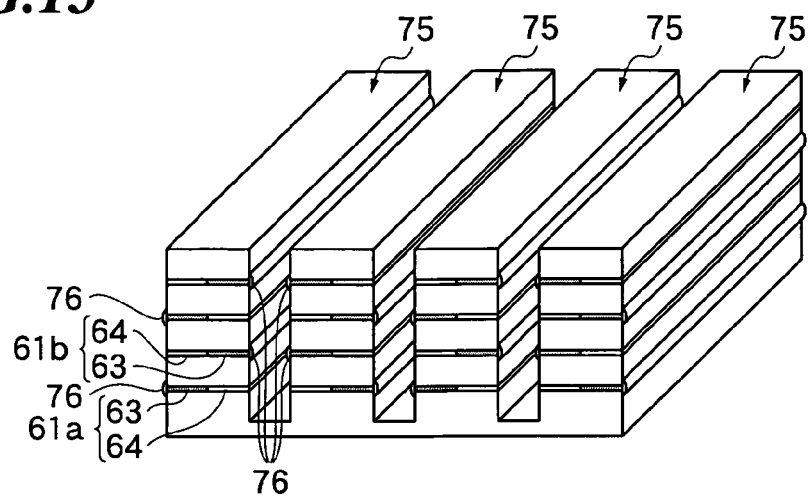
FIG. 13 is a perspective view for explanation of the method of manufacturing the multilayered structure and the multilayered structure array according to the second embodiment of the present invention.

Then, as shown in FIG. 12C, the plural rectangular structures 75 are immersed in a suspension 6 in which an iron fine powder as magnetic particles is dispersed in a liquid. Thereby, magnetic particles migrate by magnetism and adhere to the end surfaces of the first conducting materials 63 exposed on the side surfaces of the respective structures 75. As a result, magnetic films 76 are formed as shown in FIG. 13.

Then, the magnetic films 76 are oxidized by heat treating the plural structures 75 on which the magnetic films 76 have been formed for 30 minutes in air in an atmosphere at 800° C. As a result, the structures 75 on which insulating films have been formed on the predetermined end surfaces of internal electrodes can be obtained. The steps of manufacturing a multilayered structure array or single multilayered structure from those structures 75 are the same as those have been described in the first embodiment by referring FIGS. 4C to 6C.

Figure 14A:
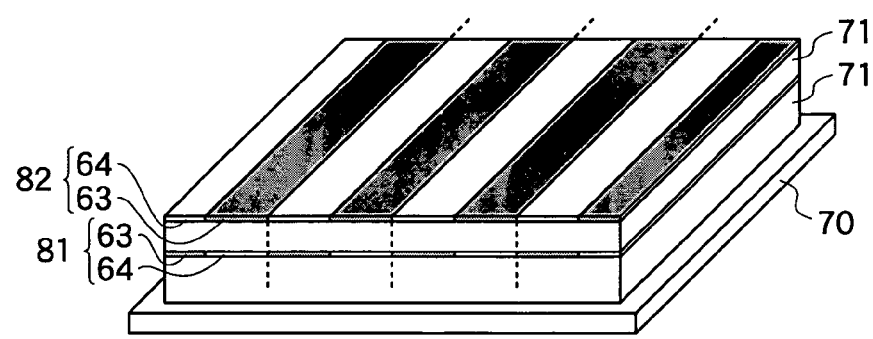
FIGS. 14A and 14B are perspective views for explanation of a modified example of the method of manufacturing the multilayered structure and the multilayered structure array according to the second embodiment of the present invention.
Figure 14B:
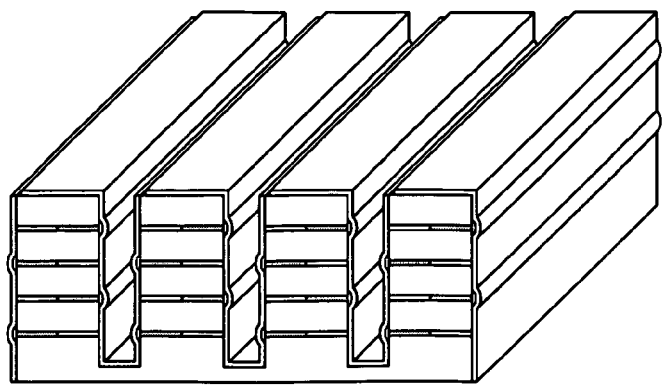
Figure 15:
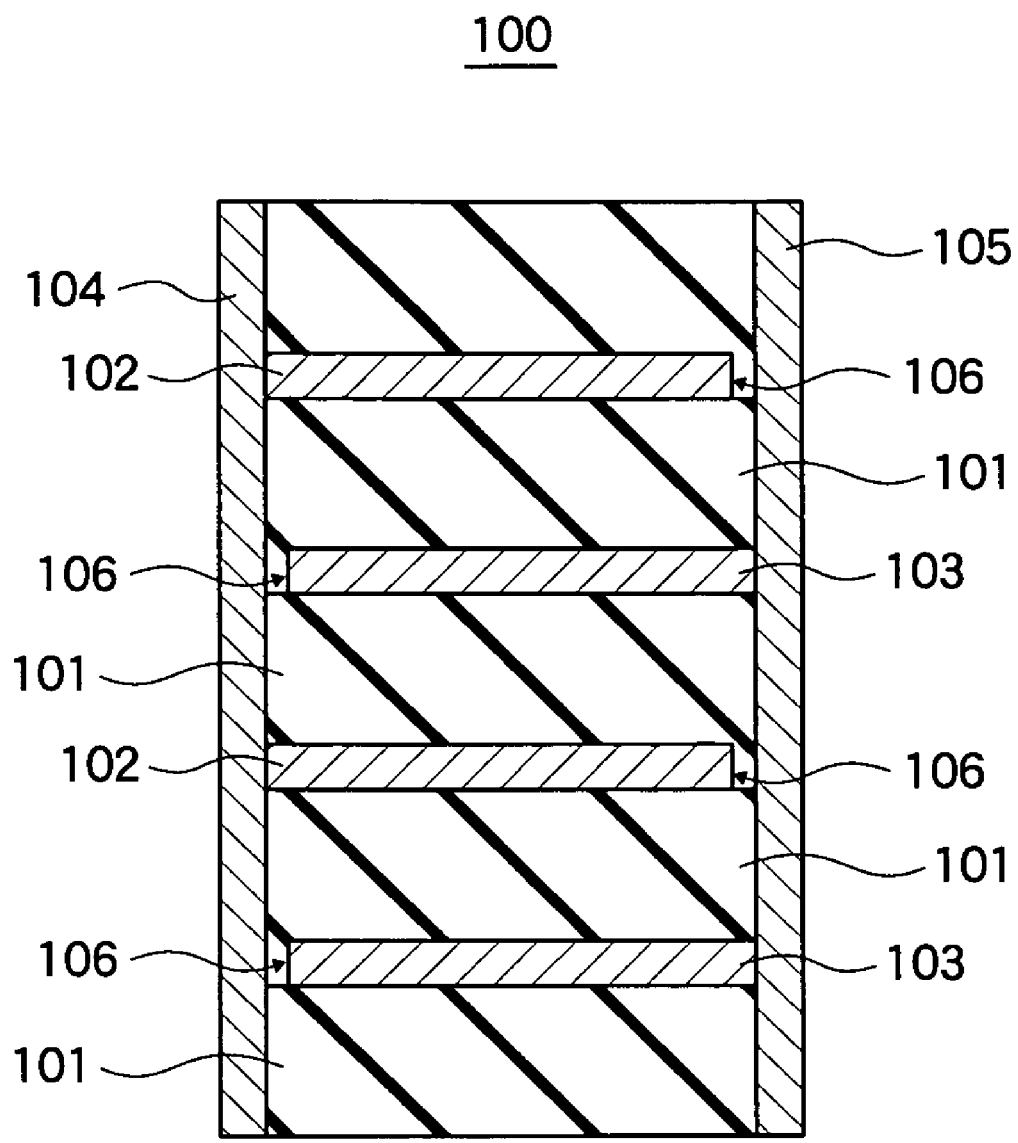
FIG. 15 is a sectional view for explanation of an interconnection method in a conventional multilayered structure.
Figure 16:
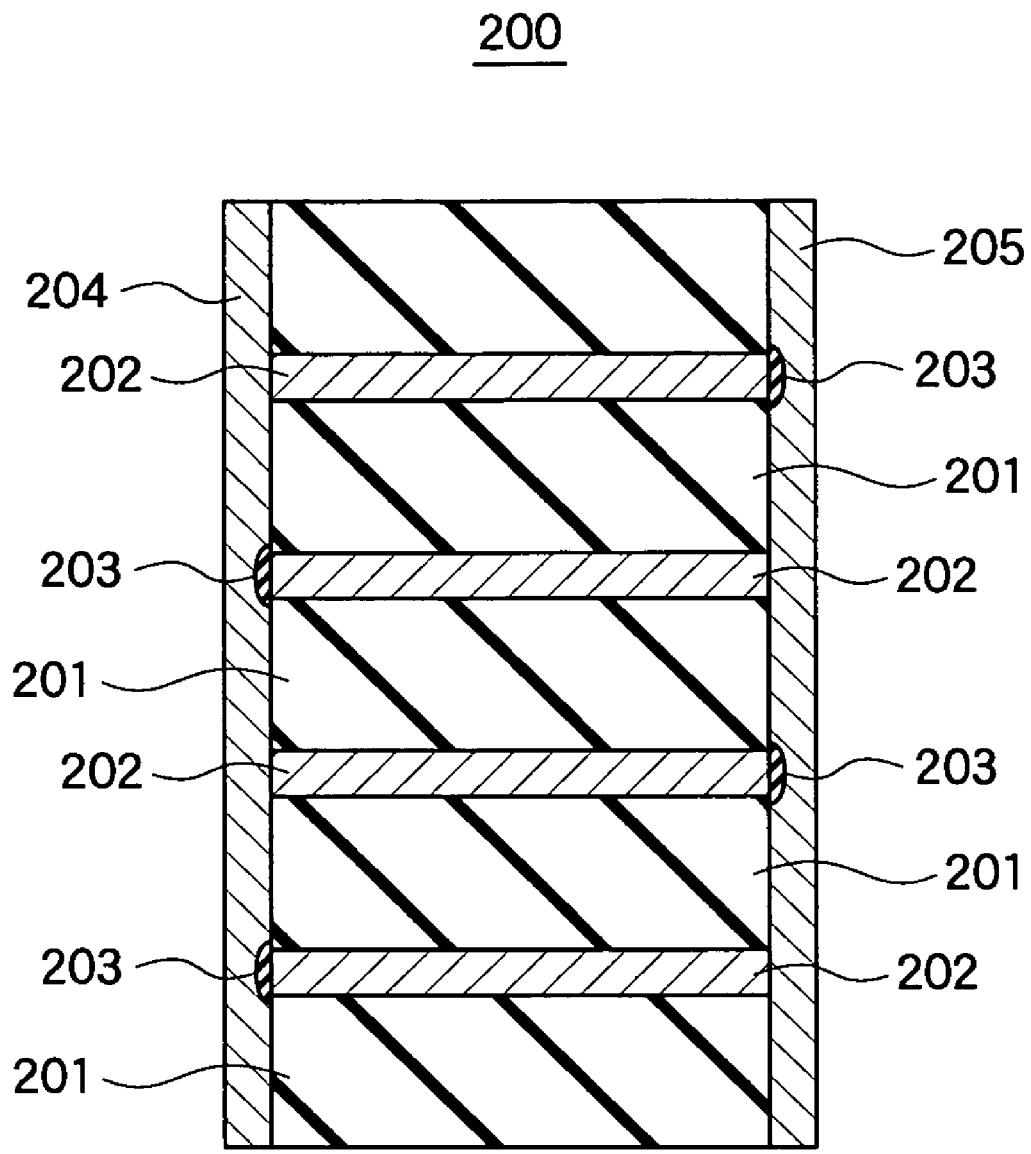
FIG. 16 is a sectional view for explanation of another interconnection method in the conventional multilayered structure.

Next, a modified example of the method of manufacturing the multilayered structure and the multilayered structure array according to the embodiment will be described. In this modified example, as shown in FIG. 14A, two kinds of the first and second conducting materials 63 and 64 are arranged in band forms such that the boundary positions between the first conducting materials 63 and the second conducting materials 64 may overlap between electrode layers 81 and electrode layers 82, which will be formed alternately. When the multilayered structure including plural piezoelectric material layers and plural electrode layers is separated into plural multilayered structures, dicing is performed at those boundaries (broken line positions in FIG. 14A). As shown in FIG. 14B, since the insulating films are formed in a staggered manner on two side surfaces opposed with grooves in between in the case where the electrode layers are thus disposed, the plural multilayered structures can be arranged with narrower pitches.

The arrangement of the two kinds of conducting materials that form the internal electrode layers are not necessarily band forms as shown in FIGS. 11B, 11D and 14A, but an arbitrary arrangement may be adopted in accordance to the shape (e.g., cylindrical shape) or arrangement (e.g., concentric or random arrangement) of multilayered structures to be fabricated. That is, it is essential only that the conducting materials having magnetism be disposed at the side surface side where the insulating films are formed. In this case, two kinds of patterns of conducting materials can be formed using a metal mask. Further, the multilayered structures may be shaped or separated so as to be in arbitrary shapes or arrangement using the sandblasting method.

Next, a second modified example of the method of manufacturing the multilayered structure and the multilayered structure array according to the embodiment will be described.

In the modified example, as the first conducting material 63 and the second conducting material 64 that form the internal electrode layers, metals or alloys both having magnetism at normal temperature but having different Curie points are used. That is, multilayered structures 75 shown in FIG. 12B are fabricated by employing a material "A" having Curie point $T_{CA}$ as the first conducting materials 63 on which the coatings 62 are formed, and a material "B" having Curie point $T_{CB}$ ($T_{CB}<T_{CA}$) as the second conducting materials 64 on which no coating 62 is formed. When magnetophoresis is performed, the temperature of the liquid in which magnetic particles have been dispersed is held at temperature T between $T_{CA}$ and $T_{CB}$ ($T_{CB}<T<T_{CA}$). Thereby, since the spontaneous magnetization of the material "B" becomes zero, the magnetic particles do not adhere to the end surfaces of the material "B", and insulating films can be selectively formed only on the end surfaces of the material "A". As the combination of material "A" and material "B", for example, permendur (Curie point 980° C.) and nickel (Curie point 354° C.) may be used.

Thus, by controlling the expression of magnetism with temperature, the range of choice of materials that can be used as conducting materials can be expanded. Further, the expression of magnetism may be controlled not only with Curie point, but also with structural phase transition temperature or glass transition point.

Thus, according to the embodiment, coatings can be easily formed on the end surfaces of internal electrode layers using magnetophoresis. Accordingly, even in the case where opposed electrodes for electrophoresis are difficult to be disposed because of size or arrangement of multilayered structures in the multilayered structure array, coatings can be easily formed on the end surfaces of internal electrode layers of each multilayered structure.

In the above-mentioned first and second embodiments of the present invention, oxidization treatment has been performed in order to make the coatings of the conducting materials covering the end surfaces of the internal electrode layers to have insulation, not only the oxidization treatment but also nitriding treatment, fluorination treatment, or sulfuration treatment may be used. For example, in the case of using fluorination treatment, nickel films are formed on the end surfaces of the internal electrode layers, the nickel films are chloridized using hydrochloric acid, and then, fluorine is allowed to act thereon in an atmosphere at 150° C. Thereby, nickel fluoride ($NiFe_2$) having insulation can be formed.

Further, in the first and second embodiments of the present invention, dicing has been performed while not completely separating the workpiece shown in FIGS. 2C and 12A or the like in order to hold the arrangement of the plural multilayered structures in a finished product. However, the manufacturing process may be advanced with the substrate used at the time of workpiece formation mounted. In this case, when the workpiece is divided into plural structures, the dicing may be performed to the lower bottom surface of the workpiece. Further, in the case, the plural structures can be completely separated from one another by removing the substrate by peeling or grinding.

The invention claimed is:

1. A multilayered structure comprising:
   a first internal electrode layer;
   a dielectric layer formed on said first internal electrode layer;
   a second internal electrode layer formed on said dielectric layer;
   a first coating formed on an end surface of said first internal electrode layer in a first side surface region of said multilayered structure and containing one of metal oxide, metal nitride, metal fluoride and metal sulfide in at least one part thereof; and
   a second coating formed on an end surface of said second internal electrode layer in a second side surface region different from said first side surface region of said multilayered structure and containing one of metal oxide, metal nitride, metal fluoride and metal sulfide in at least one part thereof.

2. A multilayered structure according to claim 1, wherein:
   said first internal electrode layer includes a first conducting material extending to said first side surface region and having magnetism at predetermined temperature, and a second conducting material extending to said second side surface region and having no magnetism at the predetermined temperature; and
   said second internal electrode layer includes the second conducting material extending to the first side surface region of said multilayered structure, and the first conducting material extending to the second side surface region of said multilayered structure.

3. A multilayered structure according to claim 1, further comprising:
   a first side electrode formed on the first side surface region of said multilayered structure, said first side electrode being connected to said second internal electrode layer and insulated from said first internal electrode layer by said first coating; and
   a second side electrode formed on the second side surface region of said multilayered structure, said second side electrode being connected to said first internal electrode layer and insulated from said second internal electrode layer by said second coating.

4. A multilayered structure according to claim 1, wherein said dielectric layer has ferroelectricity.

5. A multilayered structure according to claim 1, wherein said dielectric layer has piezoelectricity.

6. A multilayered structure array comprising plural multilayered structures arranged in a one-dimensional manner, each of said plural multilayered structures including:
   a first internal electrode layer;
   a dielectric layer formed on said first internal electrode layer;
   a second internal electrode layer formed on said dielectric layer;
   a first coating formed on an end surface of said first internal electrode layer in a first side surface region of said multilayered structure and containing one of metal oxide, metal nitride, metal fluoride and metal sulfide in at least one part thereof; and
   a second coating formed on an end surface of said second internal electrode layer in a second side surface region different from said first side surface region of said multilayered structure and containing one of metal oxide, metal nitride, metal fluoride and metal sulfide in at least one part thereof.

7. A multilayered structure array comprising plural multilayered structures arranged in a two-dimensional manner, each of said plural multilayered structures including:
   a first internal electrode layer;
   a dielectric layer formed on said first internal electrode layer;
   a second internal electrode layer formed on said dielectric layer;
   a first coating formed on an end surface of said first internal electrode layer in a first side surface region of said multilayered structure and containing one of metal oxide, metal nitride, metal fluoride and metal sulfide in at least one part thereof; and
   a second coating formed on an end surface of said second internal electrode layer in a second side surface region different from said first side surface region of said multilayered structure and containing one of metal oxide, metal nitride, metal fluoride and metal sulfide in at least one part thereof.

8. A method of manufacturing a multilayered structure comprising the steps of:
   (a) forming a first dielectric layer;
   (b) disposing a conducting material on said first dielectric layer to form a first internal electrode layer;
   (c) forming a second dielectric layer on said first internal electrode layer;
   (d) disposing a conducting material on said second dielectric layer to form a second internal electrode layer;
   (e) forming at least one groove in a workpiece including said first dielectric layer, said first internal electrode layer, said second dielectric layer and said second internal electrode layer formed at steps (a) to (d) to produce plural structures partially connected to one another and expose the end surfaces of said first and second internal electrode layers on a first side surface region and a second side surface region different from said first side surface region of each structure respectively, and selectively forming a first conducting material film and a second conducting material film on end surfaces of said first and second internal electrode layers respectively; and
   (f) causing at least one part of each of said first and second conducting material films formed at step (e) to have insulation to form a first coating and a second coating.

9. A method according to claim 8, wherein each of steps (a) and (c) includes forming one of said first and second dielectric layer by using an aerosol deposition method of spraying a raw material powder to a foundation layer and deposing the raw material powder thereon.

10. A method according to claim 8, wherein step (f) includes one of oxidizing, nitriding, fluorinating and sulfurating the at least one part of each of said first and second conducting material films.

11. A method according to claim 8, wherein step (e) includes forming at least one part of each of said first and second conducting material films by using an electrodeposition method.

12. A method according to claim 11, wherein step (e) includes using, as the electrodeposition method, one of an electroplating method and a film forming method utilizing electrophoresis power.

13. A method according to claim 8, wherein:
- step (b) includes disposing a first conducting material having magnetism at predetermined temperature on said first dielectric layer to extend to the first side surface region of said structure and disposing a second conducting material having no magnetism at the predetermined temperature on said first dielectric layer to extend to the second side surface region of said structure;
- step (d) includes disposing the second conducting material on said second dielectric layer to extend to the first side surface region of said structure and disposing the first conducting material on said second dielectric layer to extend to the second side surface region of said structure; and
- step (e) includes forming at least one groove in said workpiece to expose said first conducting material on said first side surface region of each structure and expose said second conducting material on said second side surface region of each structure in said first internal electrode layer and expose said first conducting material on said second side surface region of each structure and expose said second conducting material on said first side surface region of each structure in said second internal electrode layer, and attaching particles having magnetism on the end surface of said first internal electrode layer in the first side surface region of each structure to form said first conducting material film and attaching particles having magnetism on the end surface of said second internal electrode layer in the second side surface region of each structure to form said second conducting material film.

14. A method according to claim 13, wherein step (e) includes immersing said plural structures in a suspension in which particles of a conducting material having magnetism are dispersed in a liquid.

15. A method according to claim 8, wherein plural sets of said first dielectric layer, said first internal electrode layer, said second dielectric layer and said second internal electrode layer are stacked by repeating steps (a) to (d).

16. A method according to claim 8, further comprising the step of:
- forming a first side electrode on said first side surface region of each structure, said first side electrode being connected to said second internal electrode layer and insulated from said first internal electrode layer by the first coating formed at step (f), and forming a second side electrode on said second side surface region of each structure, said second side electrode being connected to said first internal electrode layer and insulated from said second internal electrode layer by the coating formed at step (f).

17. A method according to claim 8, further comprising the step of:
- (g) forming, after step (f), at least one groove in each structure in a direction different from that formed at step (e) to produce plural sets of partially connected multilayered structures.

18. A method according to claim 8, further comprising the steps of:
- filling the at least one groove formed at step (e) and/or step (g) with a filling material; and
- removing, after said filling material is cured, parts partially connecting said plural structures one another.

19. A method according to claim 8, further comprising the step of:
- separating, after step (e), said plural structures partially connected to one another to produce plural multilayered structures.

20. A method according to claim 17, further comprising the step of:
- separating, after step (g), said plural sets of multilayered structures partially connected to one another to produce plural multilayered structures.

* * * * *